(12) United States Patent
Tomita et al.

(10) Patent No.: US 10,155,246 B2
(45) Date of Patent: Dec. 18, 2018

(54) ADJUSMENT METHOD OF CHEMICAL LIQUID SUPPLY DEVICE, NON-TRANSITORY STORAGE MEDIUM, AND CHEMICAL LIQUID SUPPLY DEVICE

(71) Applicant: TOKYO ELECTRON LIMITED, Tokyo (JP)

(72) Inventors: Hiroshi Tomita, Koshi (JP); Shinichi Mizushino, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 245 days.

(21) Appl. No.: 15/065,435

(22) Filed: Mar. 9, 2016

(65) Prior Publication Data

US 2016/0271640 A1   Sep. 22, 2016

(30) Foreign Application Priority Data

Mar. 20, 2015   (JP) ................................. 2015-058230

(51) Int. Cl.
| | | |
|---|---|---|
| *B05D 3/12* | (2006.01) | |
| *B05D 1/02* | (2006.01) | |
| *H01L 21/67* | (2006.01) | |
| *G03F 7/16* | (2006.01) | |
| *B05D 1/00* | (2006.01) | |

(52) U.S. Cl.
CPC ............... *B05D 1/02* (2013.01); *G03F 7/168* (2013.01); *H01L 21/6708* (2013.01); *H01L 21/67253* (2013.01); *B05D 1/005* (2013.01); *G03F 7/162* (2013.01); *H01L 21/6715* (2013.01)

(58) Field of Classification Search
CPC ........... B05D 1/02; B05D 1/005; G03F 7/168; G03F 7/162; H01L 21/6708; H01L 21/67253; H01L 21/6715

USPC .......................................................... 427/240
See application file for complete search history.

(56) References Cited

U.S. PATENT DOCUMENTS

| | | | | |
|---|---|---|---|---|
| 2003/0047136 A1* | 3/2003 | Yang | ................... | B05C 11/1002 118/684 |
| 2008/0100809 A1* | 5/2008 | Nakashima | ......... | H01L 21/6715 355/27 |
| 2015/0004720 A1* | 1/2015 | Liu | ................... | H01L 21/02282 438/7 |

FOREIGN PATENT DOCUMENTS

| | | |
|---|---|---|
| JP | 2000-82646 A | 3/2000 |
| JP | 2008-183559 A | 8/2008 |
| JP | 2010-279932 A | 12/2010 |

(Continued)

*Primary Examiner* — Kirsten Jolley
(74) *Attorney, Agent, or Firm* — Nath, Goldberg & Meyer; Jerald L. Meyer

(57) ABSTRACT

A method for adjusting a chemical liquid supply device of supplying a chemical liquid through a nozzle for removing a coating film on a peripheral portion of a substrate having the coating film formed on a surface thereof and horizontally held by a holding table is provided. The method includes discharging the chemical liquid from the nozzle, performing, by an image pickup part, continuous image pickup on a region including a leading end of the nozzle and a region in which the chemical liquid discharged from the leading end forms a liquid stream in the air, acquiring area change data representing a temporal change in area of the chemical liquid in an image pickup region based on an image pickup result obtained by the image pickup part, and adjusting a supply control device installed in a chemical liquid supply path connected to the nozzle based on the area change data.

8 Claims, 17 Drawing Sheets

(56) References Cited

FOREIGN PATENT DOCUMENTS

JP  2012-9812 A  1/2012
JP  2014-217967 A  11/2014

\* cited by examiner

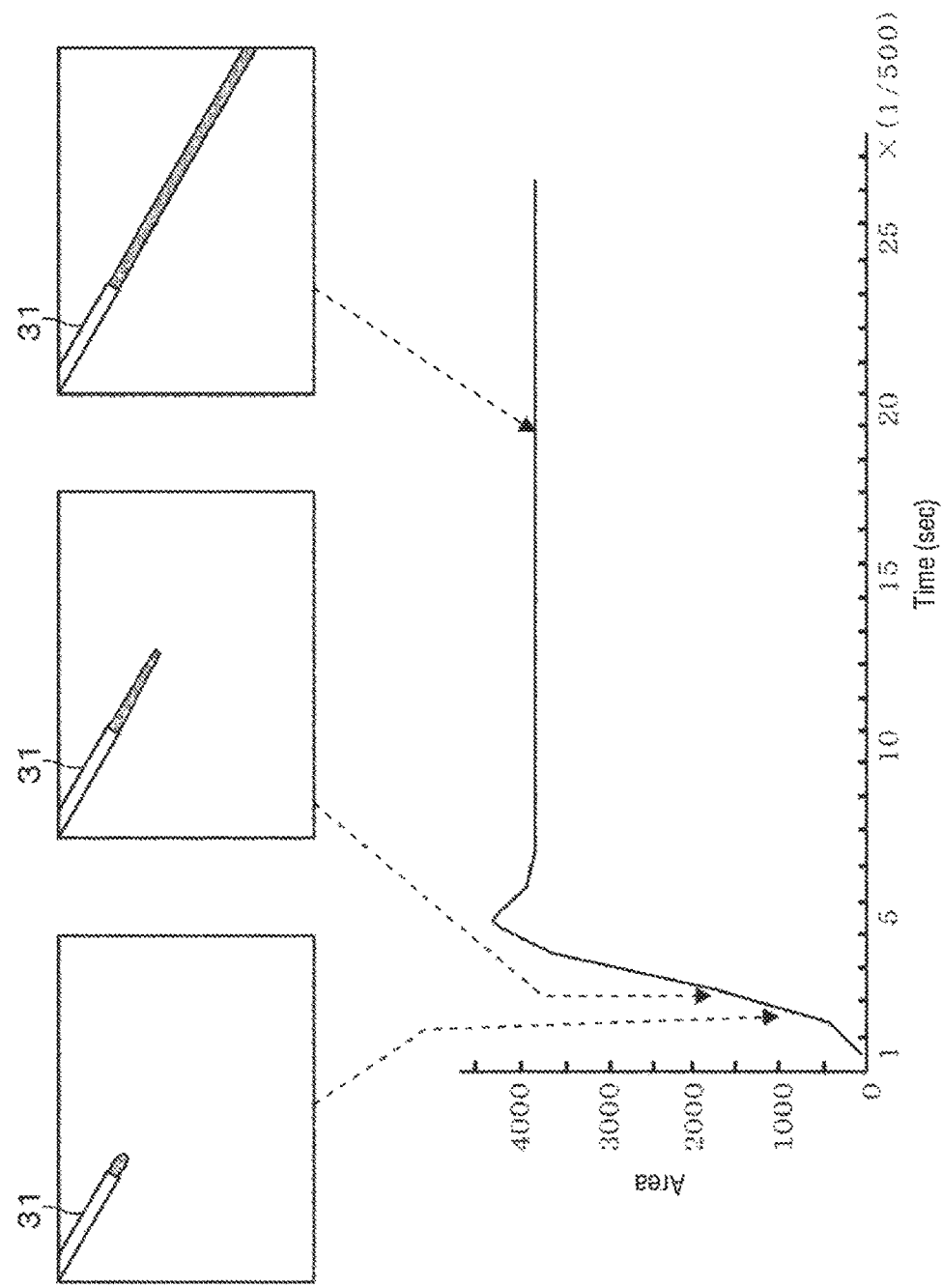

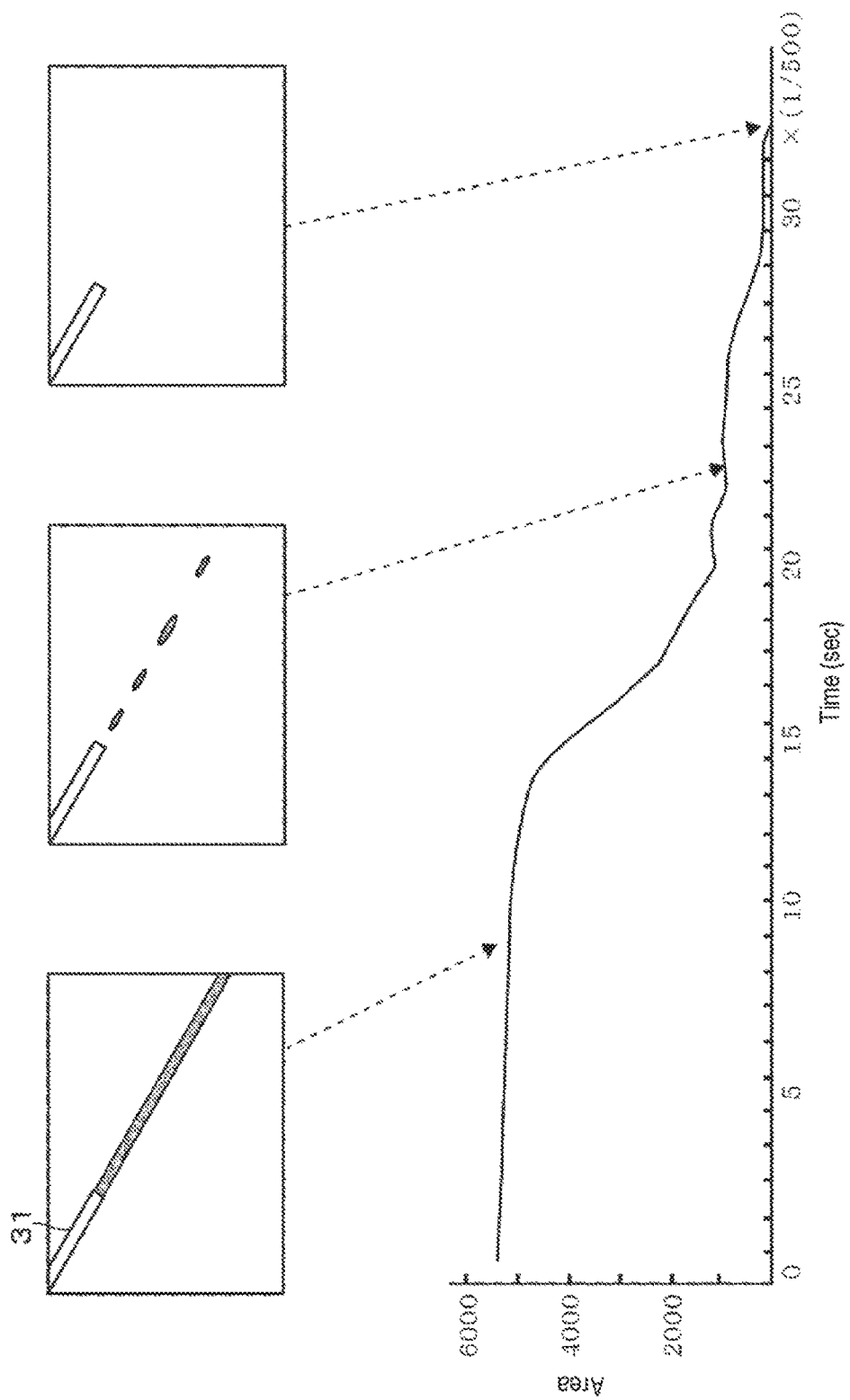

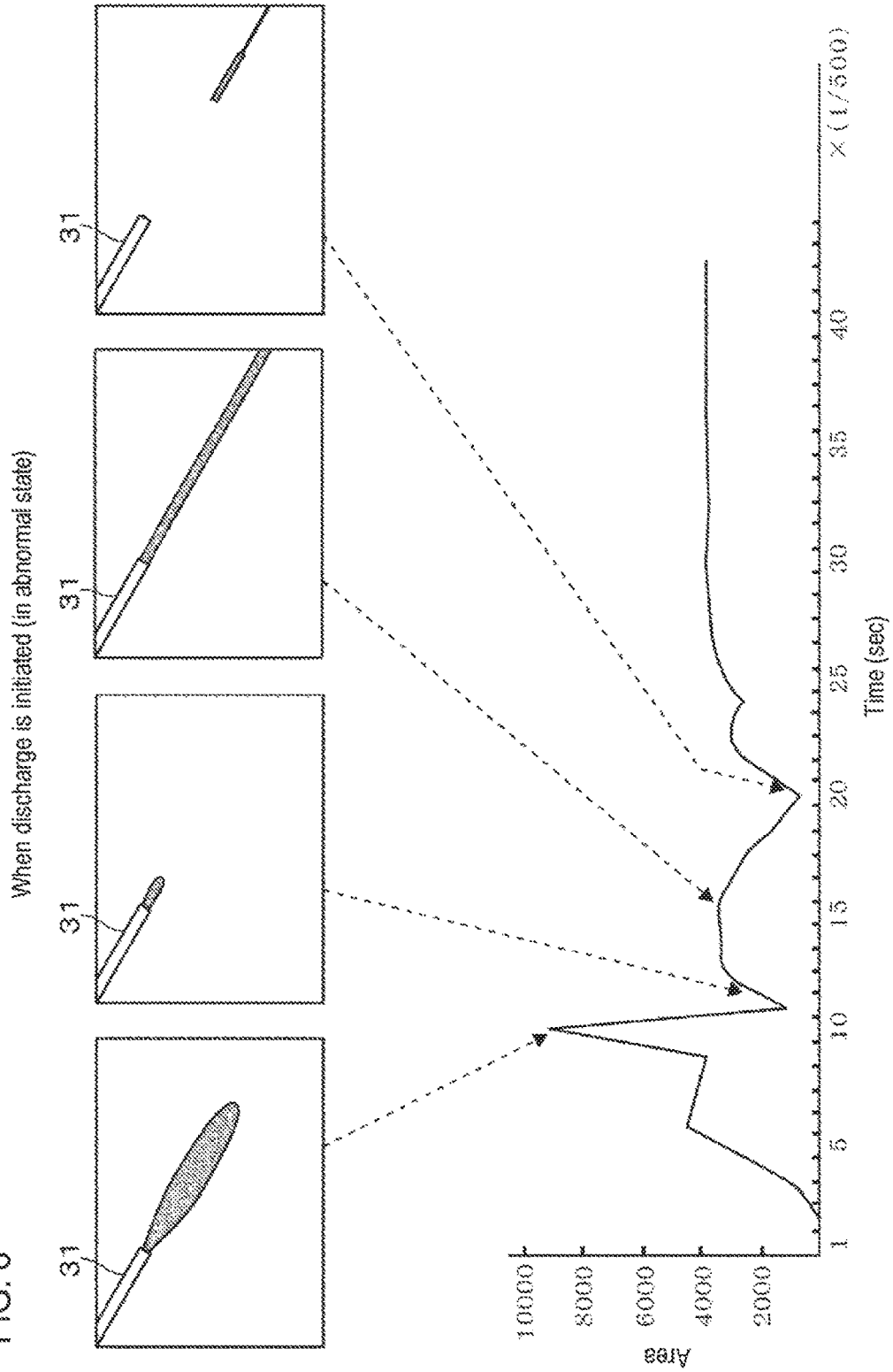

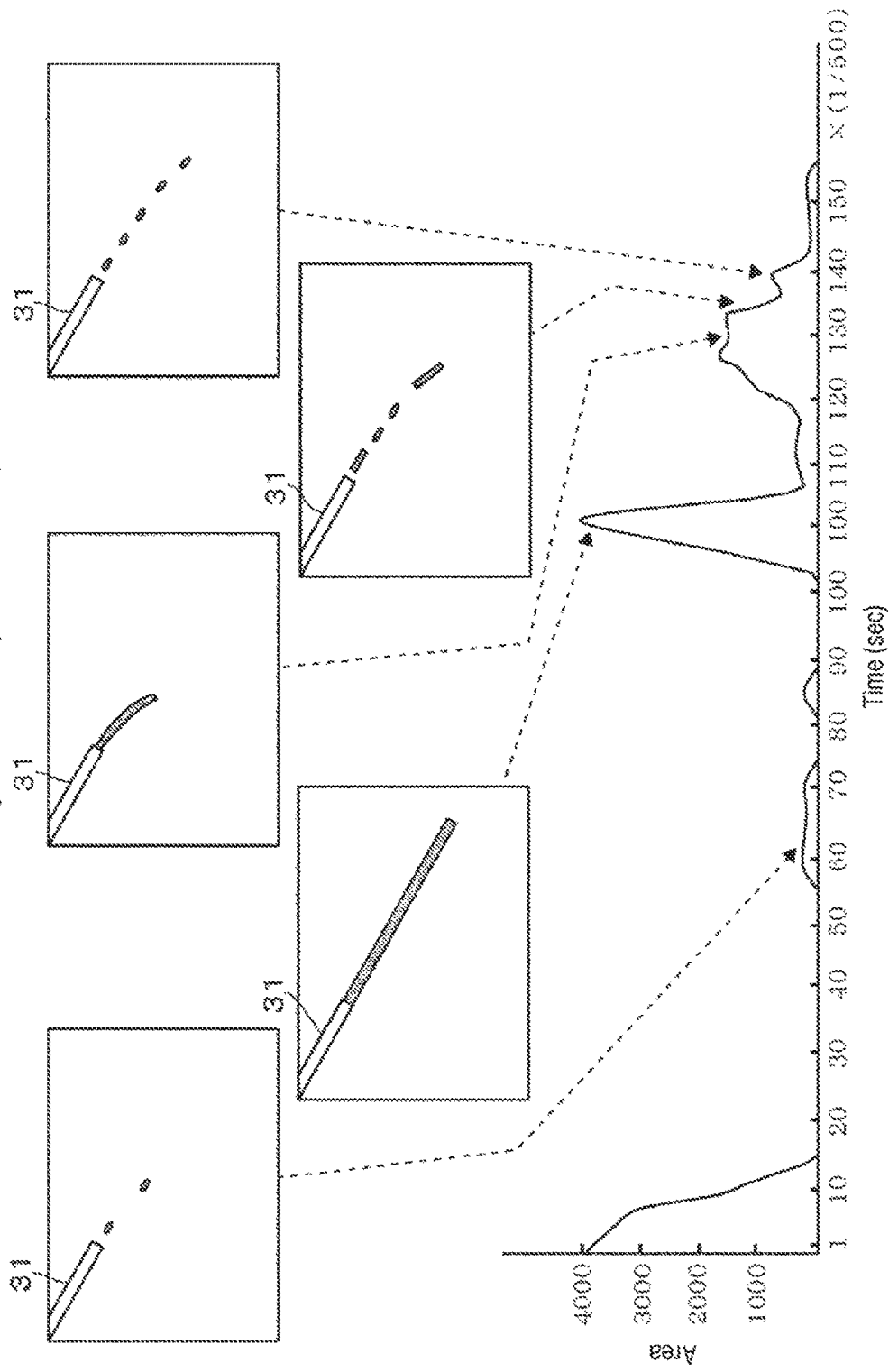

Accumulated image when discharge is initiated

Accumulated image when discharge is continued

Accumulated image when discharge is terminated

Accumulated image in entire discharge time period

Normal

Abnormal (broken liquid column)

Abnormality (short liquid column)

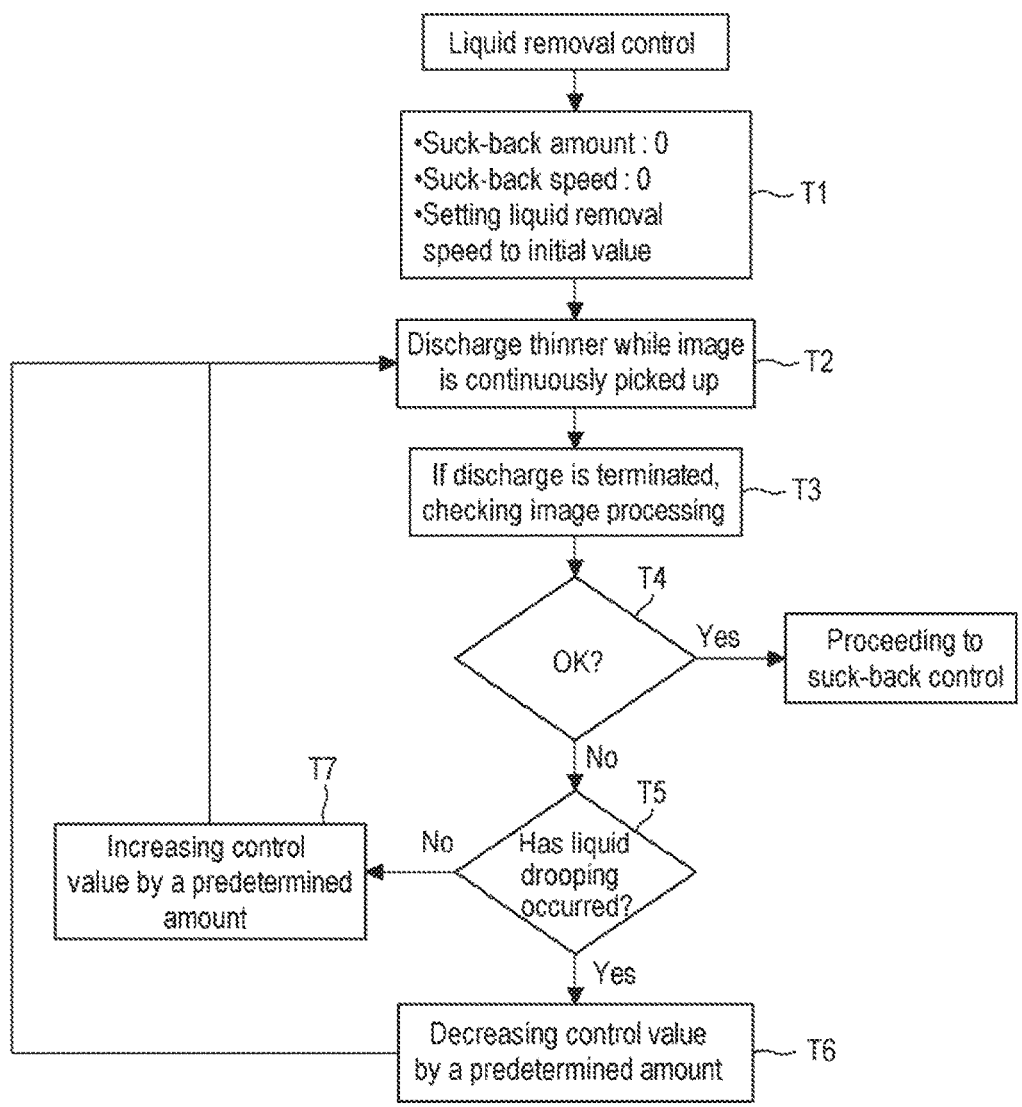

ADJUSTMENT METHOD OF CHEMICAL LIQUID SUPPLY DEVICE, NON-TRANSITORY STORAGE MEDIUM, AND CHEMICAL LIQUID SUPPLY DEVICE

CROSS-REFERENCE TO RELATED APPLICATION

This application claims the benefit of Japanese Patent Application No. 2015-058230, filed on Mar. 20, 2015, in the Japan Patent Office, the disclosure of which is incorporated herein in its entirety by reference.

TECHNICAL FIELD

The present disclosure relates to a technique of performing liquid processing by supplying a substrate with a chemical liquid from a nozzle.

BACKGROUND

A process of forming a coating film on a surface of a substrate is one of semiconductor manufacturing processes. Examples of the coating film may include a resist film, an anti-reflection film, an organic film or an insulating film serving as an etching mask, and the like. In the process of forming the coating film, spin coating is mainly used in which a chemical liquid is spread by rotating a substrate, and a liquid film of the chemical liquid is formed on the entire surface of the substrate by the spin coating. Since the liquid film is wrapped around a peripheral portion of the substrate when the liquid film is formed, a film is peeled off from the peripheral portion and therefore results in particle contamination. Alternatively, a film is attached to a transfer arm when the substrate is transferred by the transfer arm, and therefore, a subsequent substrate may be contaminated when the transfer arm transfers the subsequent substrate.

For this reason, after a coating film is formed on a surface of a substrate, a process for removing the coating film at a peripheral portion of the substrate is performed by a chemical liquid for removing the coating film, e.g., a solvent. When the substrate is a semiconductor wafer, after the spin coating is terminated, the process is performed in such a manner that the solvent is discharged from a nozzle to the peripheral portion of the substrate while the substrate is rotated using a spin chuck.

Meanwhile, there is a request for allowing a formation region of a device to approach the circumferential end of a substrate as close as possible in order to make effective use of the substrate. In order to meet the request, it is necessary to allow the removal width of a coating film at the peripheral portion of the substrate to be as narrow as possible and uniform in the circumferential direction. In this respect, before a coating film forming apparatus is operated, it is required to perform the fine control on a discharge state of a solvent from a nozzle (including a non-discharge state). The control is performed while an operator observes the discharge state of the solvent from the nozzle with the naked eye. The coating film forming apparatus, together with a heating unit or a transfer system, is generally disposed in a housing. In addition, the coating film forming apparatus is configured such that some components of a supply control device of a chemical liquid, such as a cup module for performing the spin coating, a discharge nozzle of the chemical liquid, and a valve, are accommodated in a case body.

For this reason, the operator should observe a discharge state of the solvent from the nozzle within the narrow and dark apparatus in which members are densely aggregated. Therefore, although the operator lights the inside of the apparatus using a flashlight, it is difficult to perform an operation. In particular, it is difficult to determine whether any splash occurs, or the like. In addition, since the determination of whether the discharge state is satisfactory is made by operator's experience, it is unavoidable that the determination includes a difference between individuals. For example, a technique has been proposed in which a discharge direction of a removal liquid is adjusted by picking up images of directions that the removal liquid of a coating film is discharged to a peripheral portion of a substrate and the removal liquid is scattered from the peripheral portion by a CCD camera. However, the technique is not to adjust the discharge state or the non-discharge state of the removal liquid from a nozzle.

SUMMARY

Some embodiments of the present disclosure provide a technique in which when a chemical liquid for coating film removal is supplied from a nozzle to a peripheral portion of a substrate having a coating film formed thereon, an adjustment operation of a discharge state (including a non-discharge state) of the nozzle can be easily performed.

According to one embodiment of the present disclosure, there is provided a method for adjusting a chemical liquid supply device of supplying a chemical liquid through a nozzle for removing a coating film on a peripheral portion of a substrate having the coating film formed on a surface thereof and horizontally held by a holding table, including: discharging the chemical liquid from the nozzle; performing, by an image pickup part, continuous image pickup on a region including a leading end of the nozzle and a region in which the chemical liquid discharged from the leading end forms a liquid stream in the air; acquiring area change data representing a temporal change in area of the chemical liquid in an image pickup region based on an image pickup result obtained by the image pickup part; and adjusting a supply control device installed in a chemical liquid supply path connected to the nozzle based on the area change data.

According to another embodiment of the present disclosure, there is provided a non-transitory computer-readable storage medium storing a computer program used in a chemical liquid supply device of supplying a chemical liquid for removing a coating film on a peripheral portion of a substrate having the coating film formed on a surface thereof, wherein the computer program includes a group of steps for performing the method according to the aforementioned method.

According to yet another embodiment of the present disclosure, there is provided a chemical liquid supply device of supplying a chemical liquid for removing a coating film on a peripheral portion of a substrate having the coating film formed on a surface thereof, including: a holding table configured to horizontally hold the substrate; a nozzle configured to discharge the chemical liquid to the peripheral portion of the substrate on the holding table; a drive part configured to drive the holding table such that an discharge position of the chemical liquid discharged from the nozzle is moved along a relatively outer edge of the substrate; a supply control device installed in a chemical liquid supply path connected to the nozzle to control the supply of the chemical liquid; a installation part configured to install an image pickup part, the image pickup part performing continuous image pickup on a region including a leading end of the nozzle and a region in which the chemical liquid discharged from the leading end forms a liquid stream in the air; and a control part configured to output a control signal to perform the steps of acquiring area change data representing a temporal change in area of the chemical liquid in an image pickup region, based on an image pickup result obtained by the image pickup part, and adjusting the supply control device, based on the area change data.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is an explanatory view showing an example of data acquired by a control part installed in the resist film forming apparatus.

FIG. 7 is an explanatory view showing an example of data acquired by the control part installed in the resist film forming apparatus.

FIG. 8 is an explanatory view showing an example of data acquired by the control part installed in the resist film forming apparatus.

FIG. 9 is an explanatory view showing an example of data acquired by the control part installed in the resist film forming apparatus.

FIG. 14 is a flowchart illustrating the control of the control device.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-la own methods, procedures, systems, and components have not been described in detail so as not to unnecessarily obscure aspects of the various embodiments.

Figure 1:
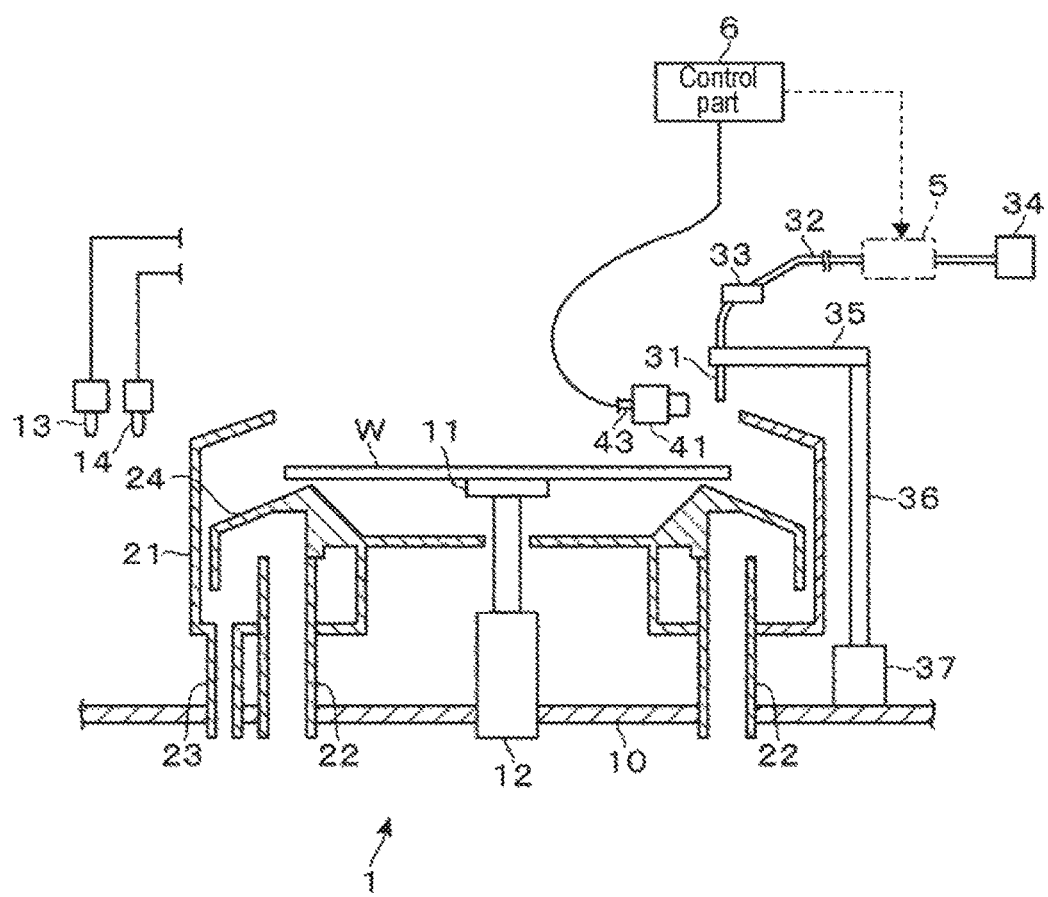
FIG. 1 is a longitudinal sectional side view of a resist film forming apparatus according to the present disclosure.
Figure 2:
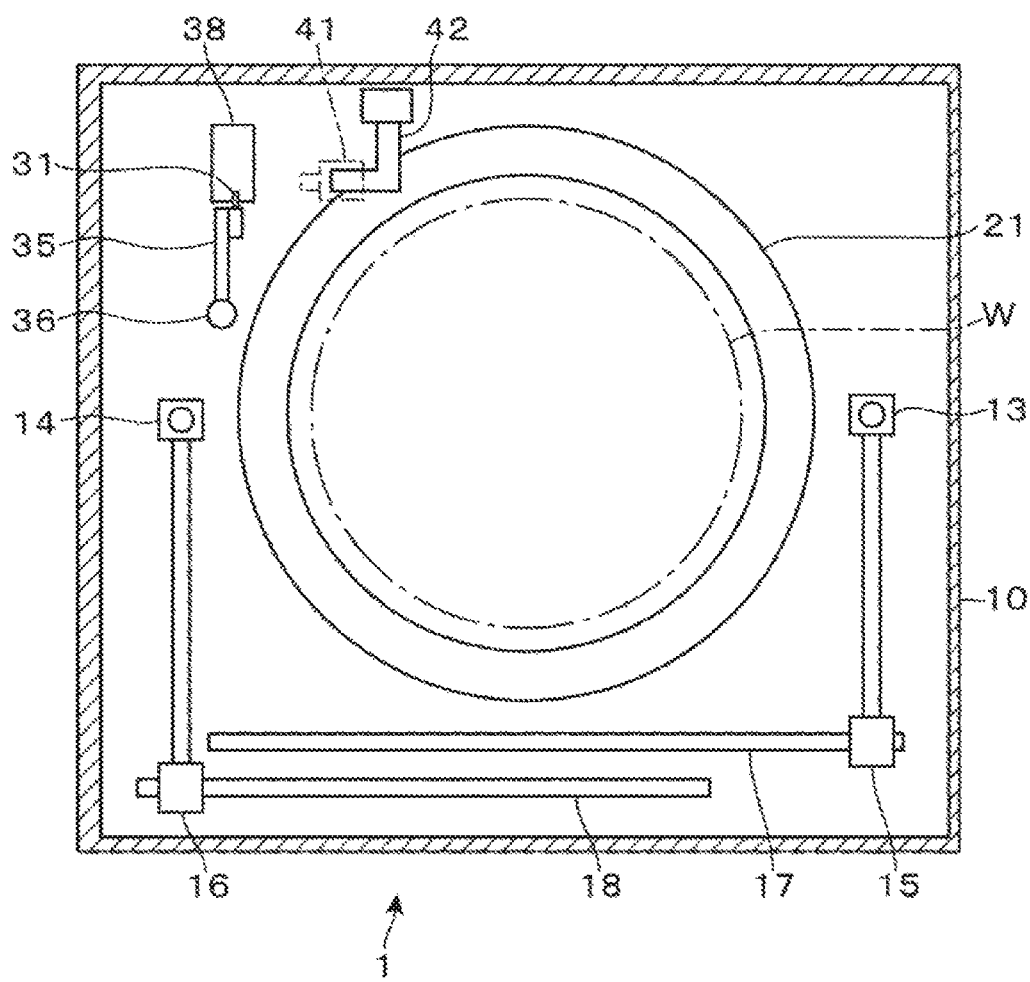
FIG. 2 is a plan view of the resist film forming apparatus.

FIGS. 1 and 2 are a longitudinal sectional side view and a plan view of a resist film forming apparatus 1 equipped with a chemical liquid supply device, respectively. In the resist film forming apparatus 1, after a resist film is formed on an entire surface of a semiconductor wafer (hereinafter, referred to as a wafer) W that is a circular substrate, a thinner that is a solvent of the resist film as a chemical liquid is supplied to a peripheral portion of the wafer W, and an unnecessary resist film at the peripheral portion of the wafer W is removed in a ring shape along the peripheral portion. When the formation of the resist film on the wafer W and the removal of the resist film at the peripheral portion (hereinafter, generally referred to as processing) are not performed, the resist film forming apparatus 1 is configured to perform the control of a supply control device installed at a pipe connected to a nozzle that supplies the thinner. In this embodiment, the control of the supply control device is automatically performed by a control part installed in the resist film forming apparatus 1.

Hereinafter, each part of the resist film forming apparatus 1 will be described. In FIG. 1, reference numeral 11 designates a spin chuck constituting a holding table of the wafer W and horizontally holds the wafer W by attracting a central portion of a rear surface of the wafer W. Reference numeral 12 designates a rotation drive part, which rotates the wafer W held by the spin chuck 11 around a vertical axis. Reference numerals 13 and 14 designate a resist discharge nozzle and a thinner discharge nozzle which vertically and downwardly discharge a resist and a thinner, respectively. The thinner discharge nozzle 14 is a nozzle that discharges the thinner so as to increase the wettability of the resist on the surface of the wafer W. The thinner discharge nozzle 14 is installed as a separate nozzle from a nozzle for removing the above-described unnecessary resist film.

As shown in FIG. 2, the resist discharge nozzle 13 and the thinner discharge nozzle 14 are connected to movement mechanisms 15 and 16 through support members, respectively. In addition, the resist discharge nozzle 13 and the thinner discharge nozzle 14 are configured to be horizontally moved up and down by the movement mechanisms 15 and 16, respectively, so as to be movable between a region above the central portion of the wafer W and a standby region outside a cup 21. In FIG. 2, reference numerals 17 and 18 designate guides for moving the movement mechanisms 15 and 16, respectively.

The cup 21 is installed to surround the wafer W held by the spin chuck 11. In FIG. 1, reference numeral 22 designates an exhaust pipe, which exhausts the interior of the cup 21. Reference numeral 23 designates a liquid discharge pipe, which is opened at a bottom of the cup 21 to remove a liquid at the bottom. In FIG. 1, reference numeral 24 designates a guide member, which is installed downward from the wafer W to guide a liquid flowing down from the wafer W to the bottom of the cup 21 and to control the flow of air current in the cup 21.

In FIG. 1, reference numeral 31 designates a thinner discharge nozzle for removing a resist film, which is formed in the shape of a rod extending diagonally downward to discharge a thinner as a chemical liquid from a leading end of the thinner discharge nozzle. In FIG. 1, reference numeral 32 designates a supply pipe constituting a chemical liquid supply path for supplying the thinner to the thinner discharge nozzle 31, and an upstream side of the supply pipe 32 is connected to a thinner supply source 34 through a flow rate detecting part 33 and a supply control device 5 in this order. The thinner discharged from the thinner discharge nozzle 31 removes a resist film at the peripheral portion of the wafer W. Thus, the adjustment of the supply control device is performed on the supply control device 5, and the thinner discharge nozzle 31, the supply control device 5, and the thinner supply source 34 constitute the chemical liquid supply device. The supply control device 5 will be described in detail below. The flow rate detecting part 33 transmits a detection signal to a control part 6 according to a flow rate of the supplied thinner.

Figure 3:
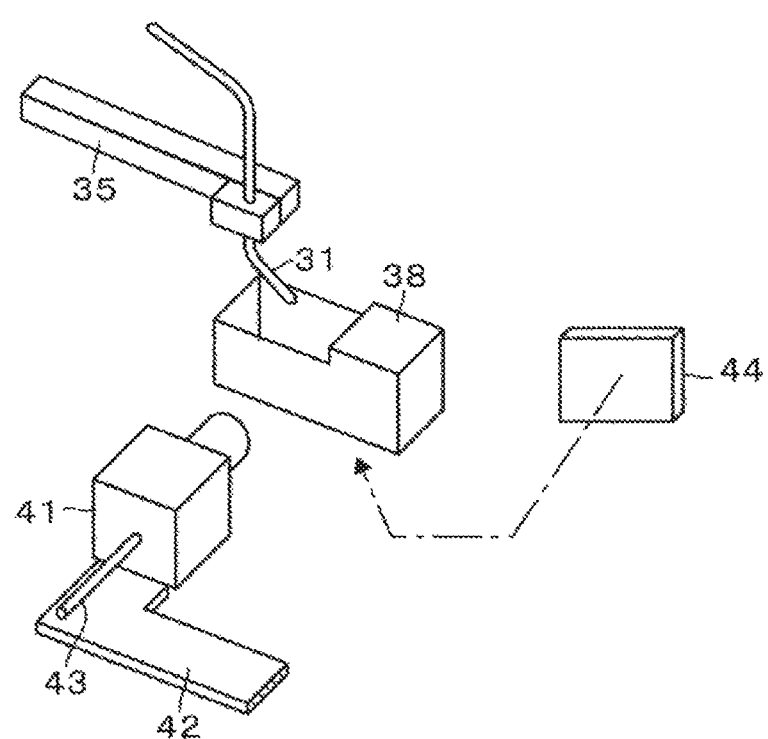
FIG. 3 is a perspective view of a nozzle for discharging a thinner, which is installed in the resist film forming apparatus.

Hereinafter, the description will be made with reference to FIG. 3 that is a perspective view of the thinner discharge nozzle 31. The thinner discharge nozzle 31 is supported at a leading end side of an arm 35, which is extendable horizontally. A base end side of the arm 35 is connected to a rotary shaft 36 shown in FIG. 1, and the rotary shaft 36 is perpendicular to the arm 35 and is rotated by a rotation mechanism 37. The thinner discharge nozzle 31 moved by the rotation of the rotary shaft 36 between an discharge position for general processing, at which the thinner is discharged onto the peripheral portion of the wafer W mounted in the cup 21, and an discharge position for testing, at which the thinner is discharged into a liquid discharge cup 38 installed at the outside of the cup 21. A liquid discharge path (not shown) for discharging the thinner is installed in the liquid discharge cup 38.

The above-described general processing will be described. The thinner discharged to the central portion of the wafer W from the thinner discharge nozzle 14 is widely spread at the peripheral portion by the centrifugal force of the rotation of the wafer W caused by the rotation drive part 12. Thereafter, like the thinner, the resist discharged to the central portion of the wafer W from the resist discharge nozzle 13 is widely spread at the peripheral portion by the centrifugal force of rotation of the wafer W, thereby forming a resist film on the entire surface of the wafer W. In this manner, the surface of the wafer W is coated with the thinner and the resist through spin coating. Subsequently, the thinner is supplied to the peripheral portion of the wafer W rotated by the rotation drive part 12 from the thinner discharge nozzle 31 located at the discharge position for the general processing, and the discharge position of the thinner is moved along the circumference of the wafer W, so that the resist film at the peripheral portion is removed.

Returning to FIG. 3, reference numeral 41 designates a camera as an image pickup part, and reference numeral 42 designates an installation part of the camera 41. The camera 41 is attachable/detachable to/from the installation part 42. For example, the camera 41 is detached from the camera installation part 42 when the general processing is performed on the wafer W and is attached to the camera installation part 42 when the adjustment of the supply control device 5 is performed. Thus, the camera 41 can be used widely in a plurality of resist film forming apparatuses 1.

The leading end of the thinner discharge nozzle 31 and a region in which the liquid stream of the thinner discharged in the air toward the liquid discharge cup 38 from the thinner discharge nozzle 31 is formed are included in an image pickup region of the camera 41 installed on the installation part 42. Picked-up data is transmitted to the control part 6, which will be described later, through a signal cable 43. In FIG. 3, reference numeral 44 designates an illumination part constituted by, for example, an LED, and irradiates the image pickup region with light such that the image pickup can be performed. In FIG. 2, the depiction of the illumination part 44 is omitted so as to prevent the drawing from being complicated. In FIGS. 1 and 2, reference numeral 10 designates a housing, which stores the cup 21 and nozzles described above.

In the adjustment of the supply control device 5, the image pickup region is continuously picked up by the camera 41 until the discharge of the thinner from the thinner discharge nozzle 31 is initiated and then terminated. When an abnormality of the discharge state is detected in the image pickup, the adjustment of the supply control device 5 is performed. The abnormality of the discharge state from the thinner discharge nozzle 31 may be, for example, a splash, and the splash instantaneously occurs. In order to pick up the instantaneously occurring splash, the image pickup may be repeatedly performed at an interval of $1/200$ second to $1/1000$ second, as the continuous image pickup. In this example, the repeated image pickup is performed at an interval of $1/500$ second.

Continuously, a configuration of the supply control device 5 will be described with reference to FIG. 4. The supply control device 5 includes a flow rate control valve 51 and a suck-back valve 52. The flow rate control valve 51 and the suck-back valve 52 are installed toward a downstream side of the supply pipe 32 in this order. The flow rate of the thinner supplied to the downstream side is controlled according to an opening degree of the flow rate control valve 51. In addition, as the flow rate control valve 51 is closed from the opened state thereof, liquid removal of the thinner being discharged from the thinner discharge nozzle 31 occurs. In some cases, a speed until the state of the flow rate control valve 51 is changed from the opened state to the closed state is referred to as a liquid removal speed.

The suck-back valve 52 is provided with a flow path of which the volume is variable, and the volume of the flow path is increased after the liquid removal of the thinner from the thinner discharge nozzle 31 occurs, so that the thinner at a downstream side of the suck-back valve 52 is sucked toward the suck-back valve 52. Thus, liquid droplets of the thinner attached to the leading end of the thinner discharge nozzle 31 are sucked and removed. In some cases, a suction operation performed by the suck-back valve 52, the amount of the thinner sucked toward the suck-back valve 52, and an operating speed of the suck-back valve 52 performing suction are mentioned as suck-back, the suck-back amount, and a suck-back speed, respectively. The opening/closing operation of the flow rate control valve 51 and the suck-back and the suck-back amount of the suck-back valve 52 are controlled by control signals output from the control part 6.

Figure 4:
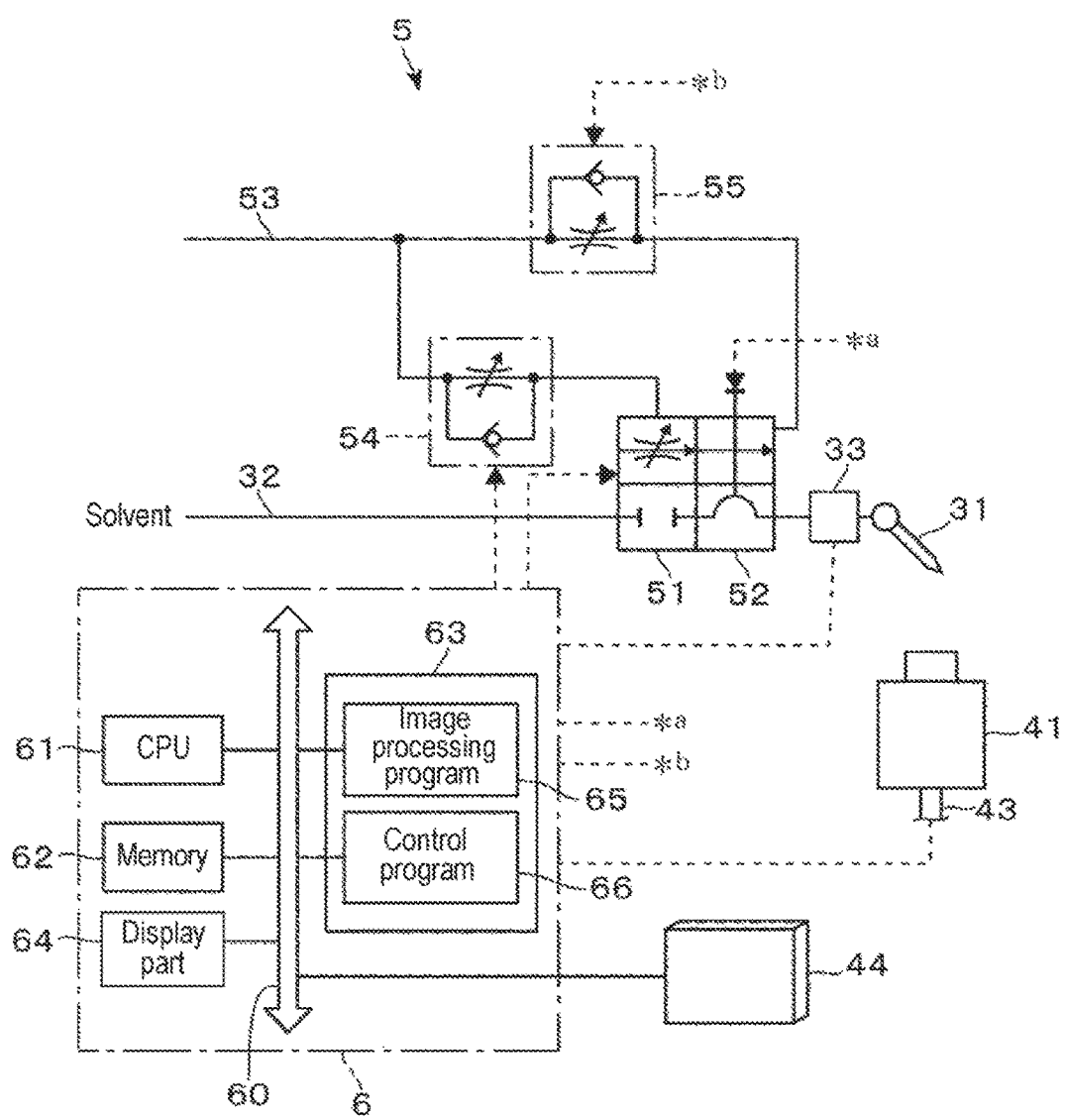
FIG. 4 is a configuration view of a supply control device for supplying a thinner to a nozzle.

In FIG. 4, reference numeral 53 designates an air supply line, of which the downstream end branches into two to be respectively connected to the flow rate control valve 51 and the suck-back valve 52. In FIG. 4, reference numerals 54 and 55 designate speed controllers installed in the branched air supply line 53, which respectively control flow rates of airs supplied to the flow rate control valve 51 and the suck-back valve 52. As air is supplied to the flow rate control valve 51, the flow rate control valve 51 is closed, and liquid removal in the thinner discharge nozzle 31 occurs. The speed of the liquid removal, i.e., the closing speed of the flow rate control valve 51, corresponds to the flow rate of the air supplied to the flow rate control valve 51. That is, the speed of the liquid removal is controlled by the speed controller 54.

In the suck-back valve 52, as air is supplied, the suck-back is performed, and the suck-back speed corresponds to the flow rate of the air supplied to the suck-back valve 52. That is, the suck-back speed is controlled by the speed controller 55. The flow rate of the air supplied to each valve by the speed controller 54 or 55 is controlled based on the control signal output from the control part 6.

Next, the control part 6 shown in FIG. 4 will be described. The control part 6 is a computer and includes a CPU 61 for performing various operations, a memory 62, a program storage part 63, and a display part 64 constituted by, for example, a display. The CPU 61, the memory 62, the program storage part 63 and the display part 64 are connected to a bus 60 included in the control part 6. In addition, the illumination part 44 or each of the parts constituting the resist film forming apparatus 1, such as the movement mechanisms 15 and 16, the rotation drive part 12, the rotation mechanism 37, the supply control device 5 and the like, which are not shown in FIG. 4 but have already been described, is connected to the bus 60.

The program storage part 63 is a storage medium that stores a program and includes, for example, a flexible disk, a compact disk, a hard disk, a magneto-optical (MO) disk, a memory card, or the like. The program is installed in the control part 6 while being stored in the program storage part 63, to output a control signal to each part of the resist film forming apparatus 1 through the bus 60, thereby performing each of the general processing and the adjustment of the supply control device 5. In FIG. 4, reference numerals 65 and 66 designate programs which are stored in the program storage part 63 to perform the adjustment of the supply control device 5. The program 65 is a program for performing image processing on the image data acquired by the camera 41, creating area change data and accumulated image data, which will be described later, and performing various displays on the display part 64. The program 66 is a program for controlling an operation of the supply control device 5 by correcting data in the memory 62, based on image data and area change data created from the image data.

For example, the image data acquired by the camera 41 is stored in the memory 62. Also, setting values for controlling operations of the speed controllers 54 and 55 are stored in the memory 62, and the operations of the speed controllers 54 and 55 are controlled based on the setting values. In addition, a setting value related to the suck-back amount is stored in the memory 62. That is, parameters that define the liquid removal speed, the suck-back amount, and the suck-back speed are stored in the memory 62. Also, a parameter that defines an opening degree of the flow rate control valve 51 when being opened, i.e., a parameter that defines a flow rate of the thinner when it is stably discharged, is stored in the memory 62.

If the liquid removal speed, the suck-back speed, and the suck-back amount are inappropriately set, the discharge state of the thinner becomes abnormal. In addition, if bubbles are contained in the thinner supplied to the thinner discharge nozzle 31, the discharge state becomes abnormal. The adjustment of the supply control device 5 is performed such that the discharge state of the thinner becomes normal by setting an appropriate value to the parameter and removing bubbles of the thinner in the supply pipe 32. Here, the discharge state of the thinner include a state after a control signal for stopping the discharge of the thinner is output from the control part 6.

When the adjustment of the supply control device 5 is performed, a control signal (discharge initiation trigger) for initiating the discharge of the thinner is output to the flow rate control valve 51 while the thinner discharge nozzle 31 is located in the discharge position for testing on the liquid discharge cup 38, and a control signal (discharge termination trigger) for stopping the discharge of the thinner is output to the flow rate control valve 51 after the thinner is discharged. In parallel with the discharge of the thinner, the continuous image pickup, which has already been described above, is performed. The initiation timing of the continuous image pickup is a timing earlier than that of outputting the discharge initiation trigger is output, and the termination timing of the continuous image pickup is a timing later than that of outputting the discharge termination trigger.

Figure 5A:
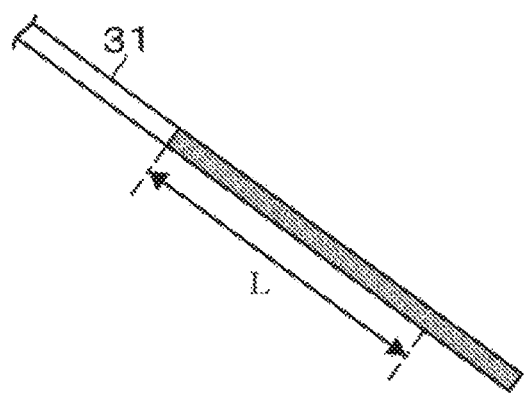
FIGS. 5A to 5C are explanatory views showing a state of a liquid stream.
Figure 5B:
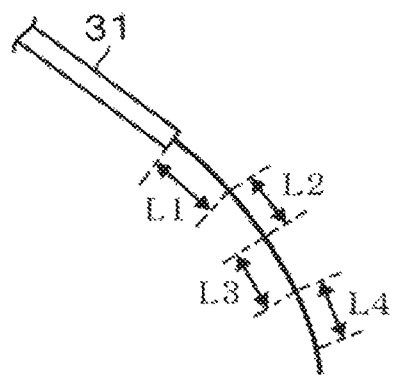
Figure 5C:
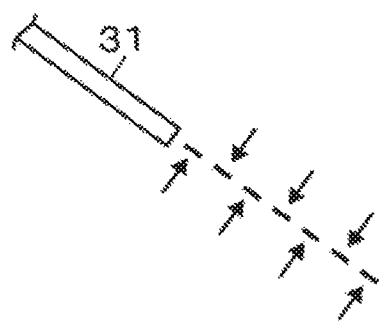

After the continuous image pickup is terminated, image processing is performed on the respective acquired image data, and the area of liquid stream of the thinner in the image data is calculated. Schematically, the calculation is performed in such a manner that a liquid stream included in a predetermined setting region in the image pickup region is considered as one rectangle or a plurality of rectangles and the sum of areas of the rectangles is obtained. FIGS. 5A to 5C show image data obtained by picking up liquid streams having different shapes. Hereinafter, a method for calculating an area of each liquid stream will be described.

When a liquid stream has a straight line shape and forms a liquid column as shown in FIG. 5A, an area of the liquid stream is calculated as length L of the liquid stream×width of the liquid stream, which is included in the setting region. When a liquid stream has a curved shape as shown in FIG. 5B, the liquid stream in the setting region is divided at, for example, points of which the curvatures are greater than a predetermined value in the setting region. In addition, each of the divided liquid streams is considered as a rectangle, and the sum of areas of the rectangles is set to an area of the liquid stream. In FIG. 5B, the liquid stream is divided into four liquid streams. If the divided liquid streams are sequentially set to first, second, third, and fourth regions from a side close to the thinner discharge nozzle 31, the area of the liquid stream is calculated as length L1 of the first region×width of the first region+length L2 of the second region×width of the second region+length L3 of the third region×width of the third region+length L4 of the fourth region×width of the fourth region.

When a plurality of liquid droplets is a dotted liquid stream as shown in FIG. 5C, each liquid droplet in the setting region is considered as a rectangle, an area of each liquid droplet is calculated, and the calculated areas are then summed up, thereby calculating an area of the liquid stream. That is, in the example of FIG. 5C, an area of each liquid droplet indicated by an arrow is calculated, and the calculated areas are summed up, thereby calculating the area of the liquid stream. When a plurality of liquid droplets are dotted in this way, the area of the liquid stream may be calculated by setting a rectangle surrounding all of the plurality of current droplets and calculating an area of the rectangle.

If the area of the liquid stream is calculated from each image data as described above, an area change data representing a change over time is created for the area. The time period (entire image pickup time period) for performing the continuous image pickup is divided into three time periods in a time series order, i.e., a time period for initiating the discharge, a time period for continuing the discharge, and a time period for terminating the discharge, and area change data is created for ever time period. The length of each time period is previously set. When the discharge is continued, the opening degree of the flow rate control valve 51 becomes constant according to an opening degree stored in the memory 62, so that the time period for continuing the discharge is included in a time period in which the discharge state is stabilized. Then, the time period for initiating the discharge includes a timing of outputting the discharge initiation trigger and a time period until the discharge state is stabilized thereafter.

Graphs of FIGS. 6 and 7 show examples of area change data when the discharge is initiated and when the discharge is terminated, respectively. The horizontal axis horizontal axis of the graph represents a lapse time (unit: second) from a predetermined time, and the vertical axis of the graph represents an area. FIGS. 6 and 7 show a case where the discharge state of the thinner is normal. In order to describe the graph, a plurality of image data acquired at different times is displayed corresponding to the horizontal axis of the graph.

In a case where the discharge of the thinner in initiating the discharge is normal, as shown in each image data of FIG. 6, the liquid column of the thinner from the thinner discharge nozzle 31 gradually extend, so that a straight line-shaped liquid stream is formed. Thus, as the area change data of FIG. 6, the area of the liquid stream is gradually increased and then becomes a predetermined value, so that the predetermined value is maintained as it is. In a case where the discharge of the thinner in terminating the discharge is normal, as shown in each image data of FIG. 7, the thinner discharged from the thinner discharge nozzle 31 is changed from the state of discharging a liquid column into a state where the liquid column is interrupted and discharged as the liquid droplets. Therefore, as time elapses, the size of the discharged liquid droplets is decreased, and an interval of the liquid droplets is increased. Thereafter, as the discharge of the liquid droplets from the thinner discharge nozzle 31 is stopped, a liquid removal occurs, and liquid droplets attached to the leading end of the thinner discharge nozzle 31 are removed by suck-back. Thus, as the time series data of FIG. 7, the area is gradually decreased from the state in which the area of the liquid stream is stabilized and then finally becomes zero (0).

Like FIGS. 6 and 7, graphs of FIGS. 8 and 9 show area change data in initiating the discharge and in terminating the discharge, respectively. However, graphs of FIGS. 8 and 9 show an example in which the discharge state of the thinner is abnormal. The area of a liquid stream is rapidly increased near a lapse time of $10 \times \frac{1}{500}$ second shown in the graph of FIG. 8 and then rapidly decreased, thereby forming a peak. As shown in the image data, when the area of the liquid stream is increased, the discharge flow rate of the thinner from the thinner discharge nozzle 31 becomes excessive, and therefore, there occurs a splash where the width of the liquid stream swells as compared with the width of the thinner discharge nozzle 31. Then, when the area of the liquid stream is rapidly decreased, there occurs a state in which the liquid column is interrupted. This discharge state is caused when an amount of suck-back of the thinner after the just previous discharge is larger than that of the discharge of the thinner used to acquire this area change data and/or when bubbles are contained in the discharged thinner.

The area of the liquid stream initiates to be stabilized at lapse times of $13 \times \frac{1}{500}$ second to $15 \times \frac{1}{500}$ second, but thereafter, a decrease in the area of the liquid stream occurs at lapse times of $16 \times \frac{1}{500}$ second to $20 \times \frac{1}{500}$ second. As shown in the image data, the liquid column is interrupted when the area is decreased. This is caused when bubbles is contained in the thinner supplied to the thinner discharge nozzle 31. After a lapse time of $21 \times \frac{1}{500}$ second, the area of the liquid stream is increased again and then stabilized. Although not shown as image data in FIG. 8, a splash where minute liquid droplets are scattered in a relatively wide range may occur when the thinner containing bubbles is discharged. Even in this case, an area is calculated for every minute liquid droplet as described in FIG. 5C, and hence, the area of the liquid stream is changed differently from when the discharge state is normal.

As shown in the graph of area change data of FIG. 9, the area of the liquid stream is rapidly decreased and then becomes 0 at lapse times of $1 \times \frac{1}{500}$ second to $15 \times \frac{1}{500}$ second. Thereafter, the area of the liquid stream is changed between 0 and a value slightly greater than 0 at lapse times of $55 \times \frac{1}{500}$ second to $90 \times \frac{1}{500}$ second. As shown in the image data at a lapse time of $63 \times \frac{1}{500}$ second during the time period, liquid droplets are discharged from the thinner discharge nozzle 31 during the time period. In addition, a relatively large peak of the area of the liquid stream appears at a lapse time of $110 \times \frac{1}{500}$ second, and as shown in the image data, a straight line-shaped liquid stream is formed when the peak appears.

The reason why the area of liquid stream is changed in this way is that the speed for closing the flow rate control valve 51 is excessively high. Specifically, since the closing speed is high, a liquid removal of the thinner discharged from the thinner discharge nozzle 31 occurs at a relatively fast timing. However, due to a water hammer phenomenon, the thinner moves toward an upstream side at a downstream side of the flow rate control valve 51. After the thinner moves toward the upstream side, since the thinner moves to a downstream side and is discharged from the thinner discharge nozzle 31, the thinner is discharged at a relatively large flow rate after a small quantity of liquid droplets is discharged as described above. In addition, the area of the liquid stream is unstably changed at a relatively low value at lapse times of $130 \times \frac{1}{500}$ second to $150 \times \frac{1}{500}$ second. As shown in the image data, liquid droplets continuously flow down from the thinner discharge nozzle 31 during the lapse time. This is caused due to the insufficient suck-back amount. Although an example of a graph of the area change data in continuing the discharge is not shown, if the discharge state is normal, a liquid column from the thinner discharge nozzle 31 is continuously formed, thereby obtaining a graph in which the area of the liquid stream is constant. When bubbles are contained in the discharged thinner, the discharge state becomes abnormal, and hence the liquid column is interrupted, or a splash occurs. Therefore, the area of the liquid stream is varied.

Although a problem caused when the liquid removal speed is excessively low is not shown in FIGS. 8 and 9, in this case, liquid droplets of the thinner from the thinner discharge nozzle 31 continuously flow down when the discharge is terminated. Therefore, in the graph of the area change data, the area of the liquid stream is greater than 0 and is continuously changed at a relatively low value for a relatively long time. As described above, the abnormality of the discharge state of the thinner is reflected in the area change data. The adjustment of the supply control device 5 is performed using the area change data.

By the way, in addition to the area change data, accumulated image data is created from each image data. The accumulated image data is created to overlap images of the liquid stream in a plurality of image data. That is, image data of the liquid stream of the thinner formed at different times are synthesized, such that one image data is obtained. Created as these accumulated image data are four accumulated image data, i.e., accumulated image data in initiating the discharge, accumulated image data in continuing the discharge, accumulated image data in terminating the discharge, and accumulated image data in the entire image pickup time period. A liquid stream of the accumulated image data in the entire image pickup time period is obtained by synthesizing liquid streams of the accumulated image data in initiating the discharge, continuing the discharge, and terminating the discharge. An image (accumulated image) obtained from each accumulated image data is displayed on the display part 64, so that a user of the apparatus can identify whether the discharge state of the thinner is abnormal.

Figure 10A:
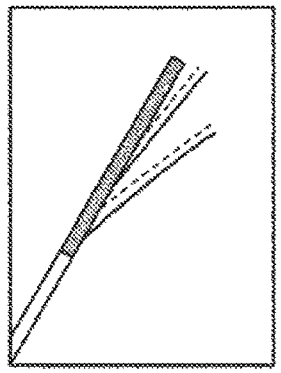
FIGS. 10A to 10D are explanatory views showing an example of data obtained by image processing of the control part installed in the resist film forming apparatus.
Figure 10B:
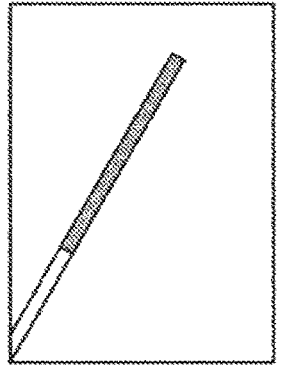
Figure 10C:
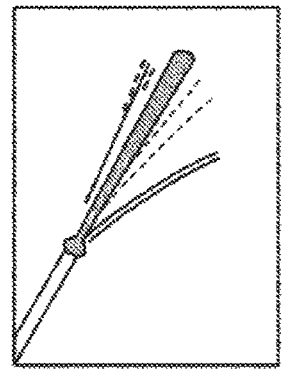
Figure 10D:
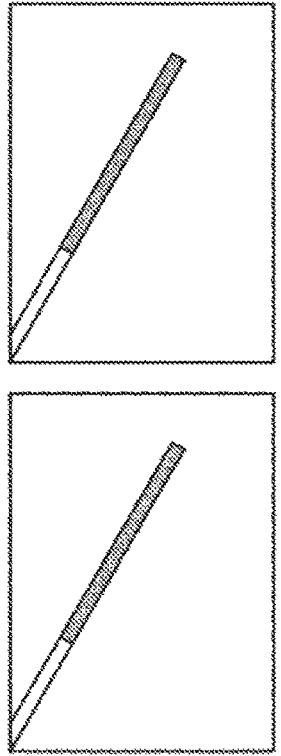

FIGS. 10A to 10D show examples of accumulated images when the discharge is initiated, accumulated images when the discharge is continued, accumulated images when the discharge is terminated, and accumulated images over the entire image pickup time period, respectively. In FIGS. 10A, 10C and 10D, examples of a normal discharge state are shown at their upper sides, and examples of an abnormal discharge state are shown at their lower sides. For the accumulated image when the discharge is initiated, any splash is not observed at the upper side of FIG. 10A, and splashes are observed at the lower side of FIG. 10A. That is, a user can determine whether the discharge state is normal or abnormal, based on whether any splash exists in the accumulated image. The splash includes the liquid stream swelling as shown in FIG. 8, in addition to the liquid droplets being scattered.

In the same manner as the accumulated image when the discharge is initiated, splashes are observed or not observed in the accumulated image when the discharge is continued. The user may determine that the discharge state is normal when no splash is observed as shown in FIG. 10B, and determine that the discharge state is abnormal when splashes are observed. In the accumulated image when the discharge is terminated in FIG. 10C, a liquid stream having a high perpendicularity is observed when liquid drooping occurs from the thinner discharge nozzle 31. Therefore, the user may determine that the discharge state is normal when such a liquid stream is not observed and may determine that the discharge state is abnormal when such a liquid stream is observed. Since the accumulated image in the image pickup time period in FIG. 10D is obtained by synthesizing the accumulated images when the discharge is initiated, when the discharge is continued, and when the discharge is terminated, the user may determine that the discharge state is normal when any splash or liquid stream having a high perpendicularity is not observed and may determine that the discharge state is abnormal when splashes or a liquid stream having a high perpendicularity is observed.

In this embodiment, since the adjustment of the supply control device 5 is automatically performed, the determination of whether the discharge state is normal is performed by the control part 6. Thus, although the user's determination based on the above-described accumulated images is not performed, it is effective for the user to determine whether the discharge state is normal by using the accumulated images so as to manually perform the adjustment of the supply control device 5 as will be described later.

Figure 11:
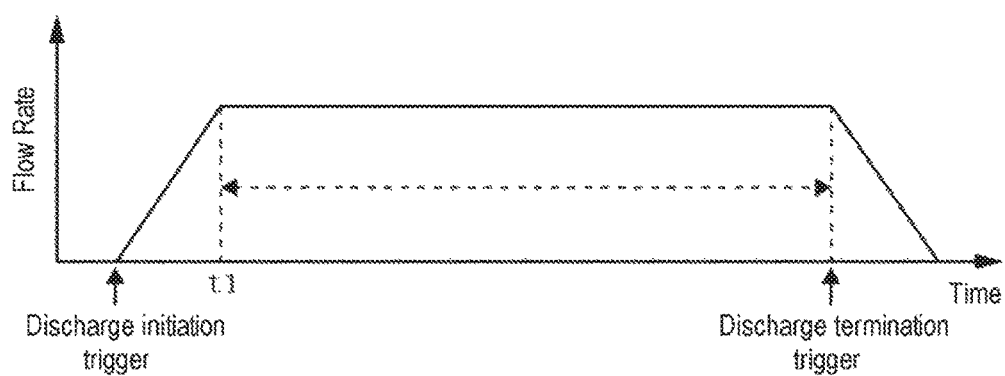
FIG. 11 is a graphic diagram showing a relationship between flow rate and time of the thinner discharged from the nozzle.

Continuously, a graph of FIG. 11 will be described in order to illustrate the adjustment of the supply control device which is automatically performed. The graph shows a relationship between a time of a case normally discharging the thinner from the thinner discharge nozzle 31 and a flow rate of the thinner discharged from the thinner discharge nozzle 31. The horizontal axis of the graph represents a lapse time from a predetermined time, and the vertical axis of the graph represents a flow rate of the thinner discharged from the thinner discharge nozzle 31. The adjustment of the supply control device 5 is performed such that the flow rate of the thinner is changed as shown in the graph.

The change in flow rate in the graph will be described in detail. As the opening degree of the flow rate control valve 51 increases up to a time t1 that a predetermined time elapses since a discharge initiation trigger has been output, the flow rate increases. Then, as the opening degree of the flow rate control valve 51 becomes constant from the time t1 to a time that n discharge termination trigger is output, the flow rate becomes constant. Thereafter, as the opening degree of the flow rate control valve 51 is lowered from the time that the discharge termination trigger is output, the flow rate is lowered. Eventually, as the flow rate control valve 51 is closed, the flow rate becomes 0. If the time period from the time t1 to the time that the discharge termination trigger is output is set as a discharge stability time period (a time period indicated by a dotted-line arrow in the graph), the time period for continuing the discharge is included in the discharge stability time period, and the opening degree of the flow rate control valve 51, which is stored in the memory 62, defines an opening degree in the discharge stability time period.

Figure 12:
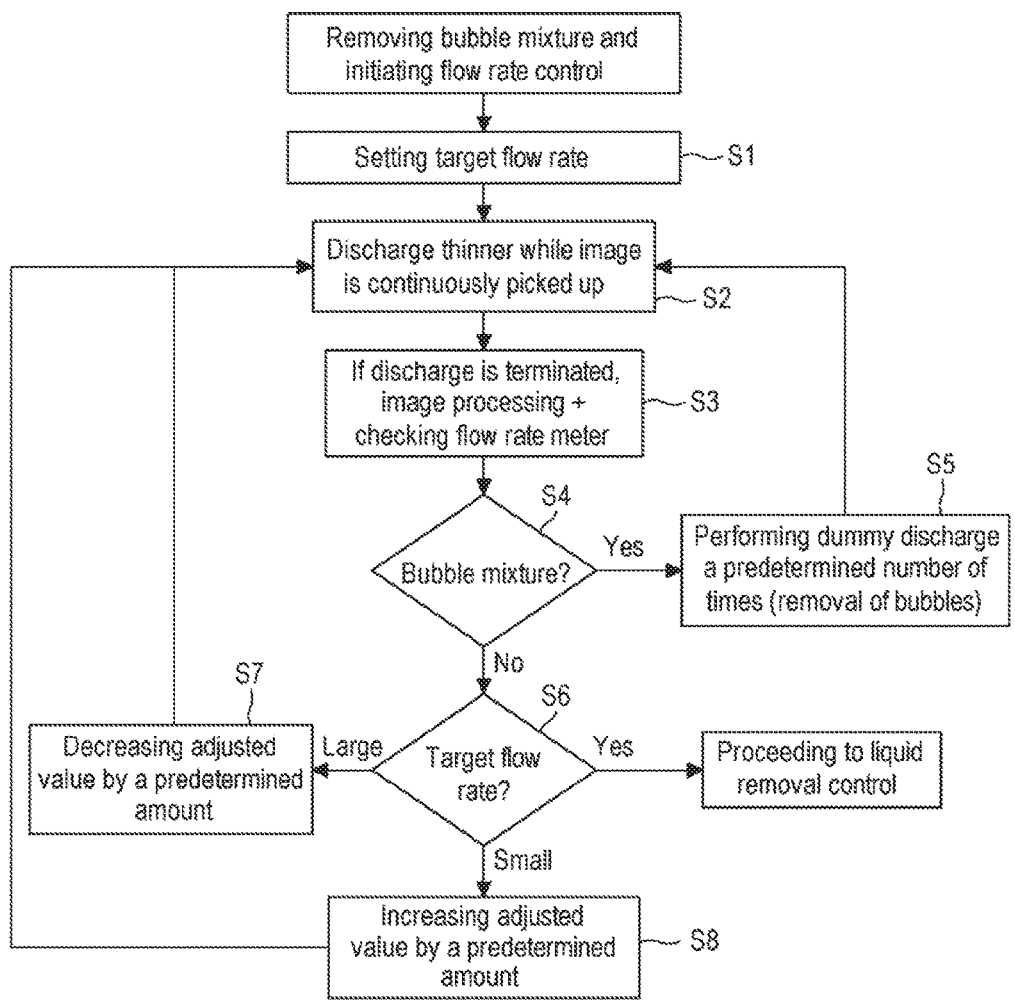
FIG. 12 is a flowchart illustrating control of the control device for supplying the thinner to the nozzle.

Hereinafter, a process of automatic adjustment of the supply control device 5 will be described. First, as shown in FIG. 12, a flow is performed for allowing the thinner supplied to the thinner discharge nozzle 31 to contain no bubble (removal of bubble mixture) and also for setting the flow rate of the thinner in the discharge stability time period as a target flow rate. If a user sets a desired target flow rate through a control part 6, the opening degree of the flow rate control valve 51 according to the setting is stored in the memory 62 (Step S1).

Thereafter, continuous image pickup is initiated by the camera 41 as described above, and a discharge initiation trigger is output slightly later than the initiation of the image pickup, so that the discharge of the thinner from the thinner discharge nozzle 31 located at the discharge position for testing is initiated. Then, the opening degree of the flow rate control valve 51 becomes the opening degree stored in the memory 62, while a detection signal from the flow rate detecting part 33 is transmitted to the control part (Step S2). Thereafter, a discharge termination trigger is output to terminate the discharge of the thinner, and the continuous image pickup is stopped slightly later than the termination of the discharge.

After the image pickup is stopped, each acquired image data is image-processed to create accumulated image data in the entire image pickup time period, accumulated image data in initiating the discharge, continuing the discharge and terminating the discharge, and area change data in initiating the discharge, continuing the discharge and terminating the discharge. In parallel with the creation of the accumulated image data and the area change data, a flow rate in the discharge stability time period is detected based on the detection signal transmitted from the flow rate detecting part 33 (Step S3). Thereafter, it is determined whether bubbles are contained in the thinner discharged from the thinner discharge nozzle 31, based on the area change data in continuing the discharge (Step S4).

Figure 13A:
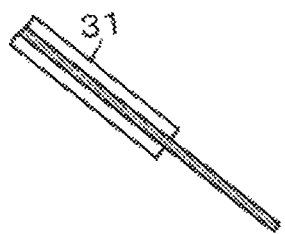
FIGS. 13A to 13C are schematic views showing a state of liquid stream of the thinner discharged from the nozzle.
Figure 13B:
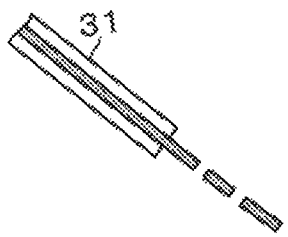

The determination in Step S4 will be described with reference to FIGS. 13A to 13B. FIGS. 13A to 13B schematically show image data acquired in the discharge stability time period, respectively. In FIGS. 13A to 13B and FIGS. 15 and 17 which will be described later, for convenience of illustration, it is shown that the thinner included in the thinner discharge nozzle 31 is picked up, but the thinner in the thinner discharge nozzle 31 may not be picked up as shown in FIGS. 6 to 9. In a case where the thinner discharged in continuing the discharge does not contain bubbles and is discharged in the normal state, a liquid stream of the thinner in all acquired image data is formed in a column shape without being interrupted, as shown in FIG. 13A. Thus, the area of the liquid stream in the area change data in continuing the discharge becomes constant.

Figure 13C:
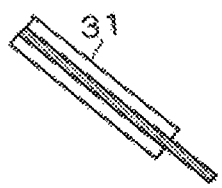

However, in a case where the discharged thinner contains bubbles and the discharge state is abnormal, image data in which a liquid column is divided plurally or is shortened as respectively shown in FIG. 13B or 13C is acquired. Therefore, the area of the liquid stream in the area change data in continuing the discharge is varied. In addition to the divided or shortened liquid stream caused by bubbles contained in the thinner as described above, the area of the liquid stream is also varied when a splash occurs. Thus, in Step S4, it is determined that no bubble is contained (there is no bubble mixture) in a case where the area of the liquid stream in continuing the discharge is constant, and it is determined that bubbles are contained (there is bubble mixture) in a case where the area of the liquid stream is varied.

If it is determined in Step S4 that bubbles are contained, the predetermined amount of the thinner is discharged into the liquid discharge cup 38 a predetermined number of times, so that the thinner in the supply pipe 32 is removed. When the thinner contains bubbles, since the bubbles are removed together with the thinner, the removal of the thinner is an operation of removing the bubbles of the thinner in the supply pipe 32 (Step S5). After Step S5 is performed, each Step from Step S2 is performed.

When it is determined in Step S4 that no bubble is contained, it is determined whether the detected flow rate corresponds to the target flow rate, whether the detected flow rate is greater than the target flow rate, and whether the detected flow rate is smaller than the target flow rate (Step S6). In Step S6, when it is determined that the detected flow rate is greater than the target flow rate, correction is made by subtracting an adjusted value of a predetermined amount from the opening degree of the flow rate control valve 51 stored in the memory 62 (Step S7). Thereafter, each Step from Step S2 is performed. In Step S6, when it is determined that the detected flow rate is smaller than the target flow rate, correction is made by adding an adjusted value of a predetermined amount to the opening degree of the flow rate control valve 51 stored in the memory 62 (Step S8). Thereafter, each Step from Step S2 is performed. In Step S6, when it is determined that the detected flow rate corresponds to the target flow rate, the process proceeds to a flow of performing the liquid removal control that is a flow of the next process.

Continuously, a flow of performing the liquid removal control will be described with reference to a flowchart of FIG. 14. Each of setting values of the suck-back amount and the suck-back speed stored in the memory 62 is changed from an initial value to 0, for example. That is, after the thinner is discharged from the thinner discharge nozzle 31, no suck-back is set to be performed. Also, the setting value of the liquid removal of the speed controller 54 stored in the memory 62 is set as an arbitrary initial value, for example (Step T1).

Figure 15:
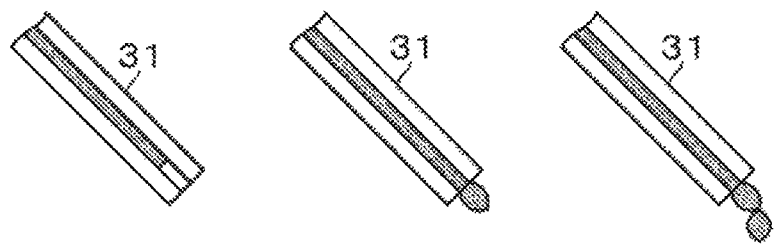
FIG. 15 is a schematic view showing a state of liquid stream of the thinner discharged from the nozzle.

Thereafter, like Step S2 in the above-described flow of removing the bubble mixture, continuous image pickup is performed by the camera 41, and the thinner is discharged during a time period of the continuous image pickup (Step T2). Then, like Step S3, each image data is image-processed to create accumulated image data in each time period and area change data in each time period (Step T3). For example, it is determined whether liquid removal is adequate, for example, based on image data lastly acquired, i.e., most newly acquired, among the image data acquired in Step T2 (Step T4). In Step T4, when the thinner is attached to the leading end of the thinner discharge nozzle 31, for example, as shown in the center of FIG. 15, it is determined that liquid removal is adequate. In addition, when no liquid droplet is attached to the leading end of the thinner discharge nozzle 31 as shown in the left side of FIG. 15 and when liquid droplets drop down from the leading end of the thinner discharge nozzle 31 as shown in the right side of FIG. 15, it is determined that the liquid removal is not adequate. In Step T4, when it is determined that the liquid removal is adequate, the flow proceeds to a flow of controlling suck-back which is the next process.

When it is determined in Step T4 that the liquid removal is not adequate, it is determined whether liquid drooping is continued long, based on the area change data when the discharge is terminated, which is acquired in Step T3 (Step T5). A specific example of the determination in Step T5 will be described. If the liquid drooping occurs, a waveform indicating that the area of liquid stream is greater than 0 and is changed with a relatively small value after the discharge stop trigger is output, appears. If the closing speed of the flow rate control valve 51 is excessively large, the time period in which such a waveform appears is relatively short as illustrated at $55 \times \frac{1}{500}$ second to $90 \times \frac{1}{500}$ second. If the closing speed of the flow rate control valve 51 is excessively small, the time period in which such a waveform appears is relatively long. Thus, for example, when the time period in which the area of the liquid stream is greater than 0 and is equal to or smaller than a predetermined value exceeds a threshold after the discharge stop trigger is output, it is determined that the liquid drooping is continued long. When the time period does not exceed the threshold, it is determined that the liquid drooping is not continued long.

If it is determined in Step T5 that the liquid drooping is continued long, the setting value of the liquid removal speed stored in the memory 62 is corrected to be increased by a predetermined amount. That is, the setting value for controlling the operation of the speed controller 54 is corrected such that the closing speed of the flow rate control valve 51 is increased by a predetermined amount (Step T6). If it is determined in Step T5 that the liquid drooping is not continued long, the setting value of the liquid removal speed stored in the memory 62 is corrected to be decreased by a predetermined amount. That is, the setting value for controlling the operation of the speed controller 54 is corrected such that the closing speed of the flow rate control valve 51 is decreased by a predetermined amount (Step T7). After Steps T6 and T7 are performed, each Step from Step T2 is performed. When it is determined in Step T4 that the liquid removal is adequate, an adjustment flow of the suck-back is initiated.

Figure 16:
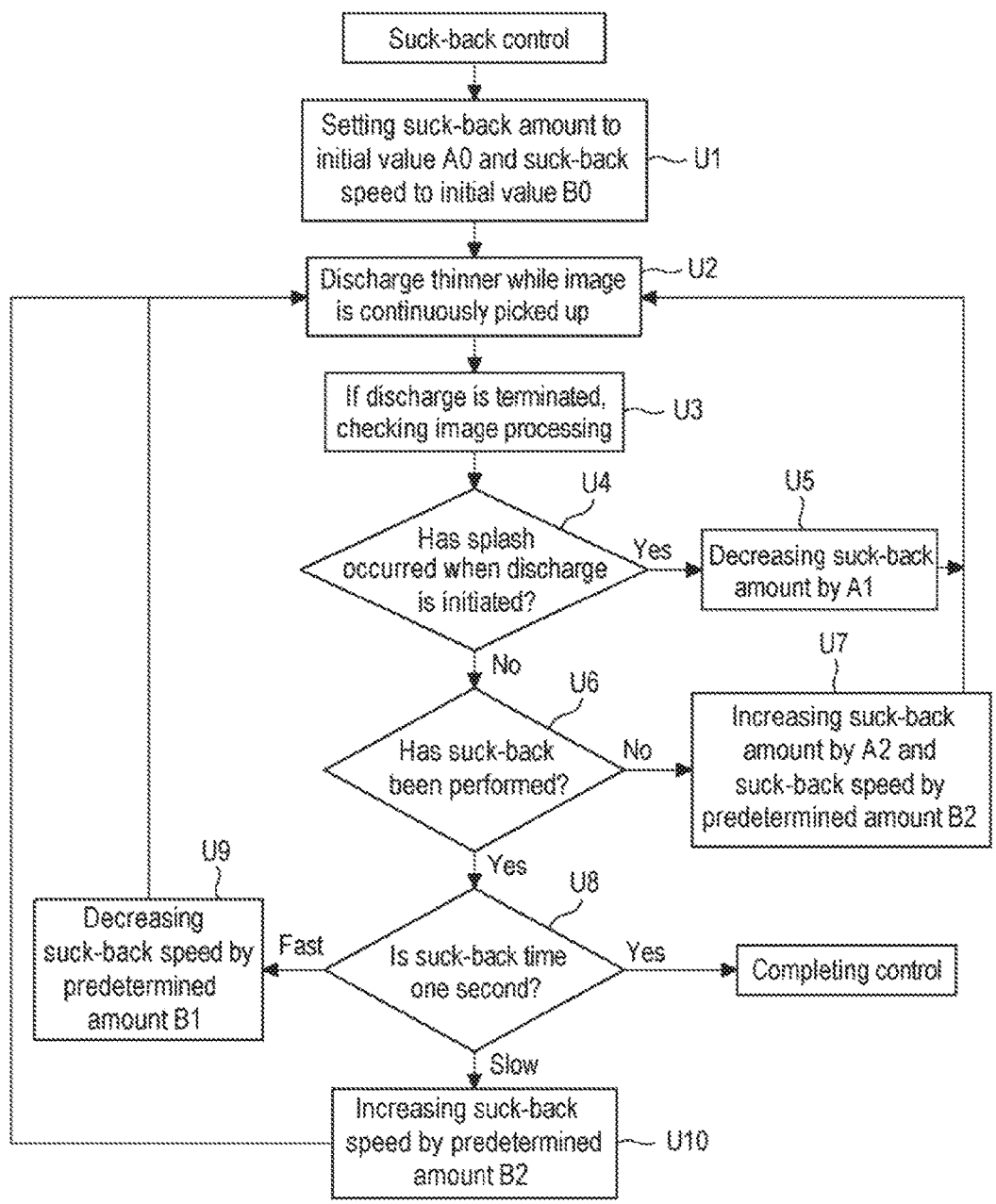
FIG. 16 is a flowchart illustrating the control of the control device.

Continuously, the adjustment flow of the suck-back will be described with reference to a flowchart of FIG. 16. In the adjustment flow, each part is adjusted such that the suck-back is performed with an appropriate amount after one second from the liquid removal. First, the setting value of the suck-back amount stored in the memory 62 is changed to an initial value A0, and the setting value of the suck-back speed is changed to an initial value B0 (Step U1). That is, the suck-back is set to be performed after the thinner is discharged. Thereafter, the thinner is discharged from the thinner discharge nozzle 31, and the suck-back is performed after the thinner is discharged.

Continuously, like Steps S2 and T2 already described above, continuous image pickup is performed by the camera

41, and the thinner is discharged during a time period of the continuous image pickup (Step U2). Then, like Steps S3 and T3, each image data is image-processed to create accumulated image data in each time period and area change data in each time period (Step U3). Thereafter, it is determined whether a splash occurs when the discharge is initiated, based on the area change data when the discharge is initiated (Step U4).

An example of this determination will be described specifically. When a splash occurs as described in FIG. 8, in some cases, the liquid column is expanded or interrupted. In addition, in some cases, liquid droplets are scattered. If the liquid column swells, the area of the liquid stream is rapidly increased. If the liquid column is interrupted or the liquid droplets are scattered, the area of the liquid stream is rapidly decreased. Thus, in Step U4, for example, when a value obtained by differentiating the graph of the area change data does not exceed a maximum threshold or a minimum threshold, it is determined that no splash has occurred. When the differential value exceeds the maximum threshold or the minimum threshold, it is determined that a splash has occurred.

Figure 17:
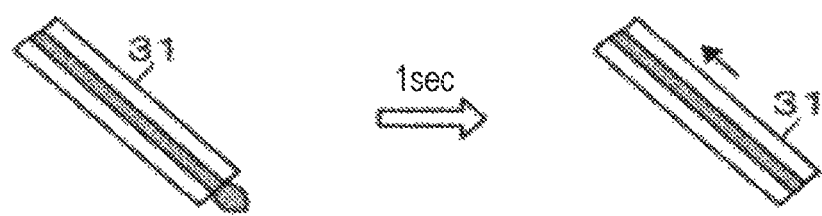
FIG. 17 is a schematic view showing a state of a leading end of the nozzle.

When it is determined in Step U4 that the splash has occurred, the setting value of the suck-back amount stored in the memory 62 is decreased by a predetermined value A1 (Step U5). After Step U5 is performed, each Step from Step U2 is performed. When it is determined in Step U4 that no splash has occurred, it is determined whether the suck-back has been performed, based on each image data when the discharge is terminated (Step U6). This determination will be described with reference to FIG. 17. For example, if an image in which a liquid droplet is attached to the leading end of the thinner discharge nozzle 31 as shown in the left side of FIG. 17 is acquired and an image in which the liquid droplet attached to the leading end is removed as shown at the right side of FIG. 17 is acquired, it is determined that the suck-back has been performed. If an image in which the liquid droplet is removed in this way is not acquired, it is determined that the suck-back has not been performed.

When it is determined in Step U6 that the suck-back has not been performed, the setting value of the suck-back amount stored in the memory 62 is increased by a predetermined amount A2, and the suck-back speed is set to be increased by a predetermined amount B2 (Step U7). After the correction is performed, each Step from Step U2 is performed.

When it is determined in Step U6 that the suck-back has been performed, it is determined whether the suck-back time corresponds to one second, later than one second, or faster than one second (Step U8). In this determination, it is determined whether the time duration from a time acquiring the image in which the liquid droplet attached to the leading end of the thinner discharge nozzle 31 is removed as shown at the right side of FIG. 17 to a time acquiring the image in which the liquid droplet is attached and maintained as shown at the left side of FIG. 17 is one second. Since image data is acquired at a predetermined interval, the determination of the suck-back time, for example, is performed based on the number of images acquired after the image in the right side of FIG. 17 is acquired and until the image in the left side of FIG. 17 is acquired.

When it is determined in Step U8 that the suck-back time is shorter than one second, the setting value of the suck-back speed stored in the memory 62 is decreased by a predetermined amount B1 (Step U9). When it is determined in Step U8 that the suck-back time is longer than one second, the setting value of the suck-back speed stored in the memory 62 is increased by a predetermined amount B2 (Step 1U10). When the suck-back speed is excessively low, liquid drooping may occur. When the suck-back speed is excessively high, bubbles are contained in the thinner, and therefore, splashes may occur when the thinner is discharged next time. In order to prevent abnormality of the discharge, the suck-back speed is controlled in Steps U8 to U10. After Steps U9 and U10 are terminated, each Step from Step U12 is performed. When it is determined in Step U8 that the suck-back time is one second, the automatic adjustment of the supply control device 5 is terminated. After the automatic adjustment is terminated, general processing is performed, and the thinner is allowed or blocked in each flow, based on the parameters set in the memory 62, thereby removing a resist film at the peripheral portion of the wafer W.

According to the resist film forming apparatus 1, when the thinner for removing a resist film is supplied to the peripheral portion of the wafer W having the resist film formed thereon through the thinner discharge nozzle 31, a region, which includes the leading end of the thinner discharge nozzle 31 and a region in which the thinner discharged from the leading end forms a liquid stream in the air, is continuously picked up by the camera 41. In addition, area change data representing a temporal change in area of the thinner in the image pickup region is acquired based on the image pickup results. Based on the area change data, each parameter stored in the memory 62, which controls an operation of the supply control device 5, is automatically adjusted, and bubbles in the supply pipe 32 are automatically removed, so that no splash of the thinner or no liquid drooping after the discharge of the thinner is terminated occurs. Thus, it is unnecessary for an operator to observe a discharge state of the thinner from the thinner discharge nozzle 31 in the narrow and dark apparatus as described in the Background section. Accordingly, the discharge state of the thinner can be easily adjusted, and the working time required to perform the adjustment can be reduced. Furthermore, when the discharge state of the thinner is determined, it is possible to prevent the occurrence of a determination difference between operators. Accordingly, it is possible to prevent the occurrence of an adjustment difference between the operators in the adjustment operation of the supply control device 5.

In addition, although a splash instantaneously occurs or liquid droplets scattered by the splash are minute, the continuous image pickup is performed, so that it is possible to acquire image data including the instantaneous splash and the minute liquid droplets. Thus, since the occurrence of the splash is more surely reflected in the created area change data, the automatic adjustment of the supply control device 5 can be performed with high accuracy. Accordingly, it is possible to more surely suppress the discharge state of the thinner from becoming abnormal in the general processing.

The adjustment of the supply control device 5 is not limited to being automatically performed by the control part 6 but may be manually performed by a user. In this case, if image data is acquired in each above-described flow, what is required for the determination, including images obtained from the image data, graphs of accumulated images and area change data, and the like, may be displayed on the display part 64. When the manual adjustment is performed in this way, the determination may be performed using accumulated images, for example, in a step in which the determination may be performed by the accumulated image data instead of the area change data. For example, the determination of the occurrence or not of the splash in Step U4 in the suck-back adjustment flow of FIG. 16 may be performed using accumulated images. In addition, the determination in Step U6 in the automatic adjustment may be performed based on accumulated images.

As such, when the user manually perform the adjustment, it is effective in terms of the work efficiency that the user acquires accumulated images as still images. For example, a moving image representing a discharge state of the thinner may be created from the acquired image data. However, in order to check abnormality of the discharge state through the moving image, it is required for the user to look over a time period from a time of initiating the moving image to a time of terminating the moving image. When the accumulated images are used as illustrated in FIGS. 10A to 10D, the abnormality of the discharge state can be checked at a glance. In addition, since the splash instantaneously occurs as described above, the abnormality of the discharge state can be easily checked using the accumulated images even when it is difficult to identify the splash through the moving picture. In the above-described example, since accumulated images in each time period of initiating the discharge, continuing the discharge, and terminating the discharge, the user can quickly check which time period the abnormality occurs is. Accordingly, the adjustment of the supply control device 5 can be quickly performed with reference to each accumulated image.

When the user manually performs the adjustment of the supply control device 5 in this way, the detection of abnormality can be easily and surely performed as compared with when the abnormality of the discharge state is detected by observing the liquid stream from the thinner discharge nozzle 31 with the naked eye, thereby reducing a user's burden. Accordingly, it is possible to reduce an adjustment operation time required to adjust the parameters and remove the thinner including bubbles. Furthermore, it is possible to suppress the occurrence of an adjustment difference between operators.

By the way, in the resist film forming apparatus 1, it is sufficient that the drive part enables the discharge position of the thinner from the thinner discharge nozzle 31 to be relatively moved with respect to the holding table of the wafer W. Therefore, the present disclosure may be applied even to an apparatus in which the wafer W is moved by the drive part in a state in which the thinner discharge nozzle 31 is stopped. In addition, the substrate applied to the present disclosure may be an angular substrate. Specifically, the present disclosure may be applied to an apparatus configured such that the discharge position of a chemical liquid discharged to an angular substrate from a nozzle is relatively moved along sides of the angular substrate by a drive part.

According to the present disclosure in some embodiments, when a chemical liquid for removing a coating film is supplied through a nozzle to a peripheral portion of a substrate having the coating film formed thereon, a region including a leading end of the nozzle and a region in which the chemical liquid discharged from the leading end forms a liquid stream in the air is continuously picked up by an image pickup part. In addition, area change data representing a temporal change in area of the chemical liquid in the image pickup region is acquired based on the image pickup result, and a supply control device installed in a chemical liquid supply path is controlled based on the area change data. Thus, it is possible to easily perform an adjustment operation of a discharge state (including a non-discharge state) of the nozzle.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for adjusting a chemical liquid supply device of supplying a chemical liquid through a nozzle for removing a coating film on a peripheral portion of a substrate having the coating film formed on a surface thereof and horizontally held by a holding table, the method comprising:
discharging the chemical liquid from the nozzle;
performing, by an image pickup part, continuous image pickup on a region including a leading end of the nozzle and a region in which the chemical liquid discharged from the leading end forms a liquid stream in the air;
acquiring area change data representing a temporal change in area of the chemical liquid in an image pickup region based on an image pickup result obtained by the image pickup part; and
adjusting a supply control device installed in a chemical liquid supply path connected to the nozzle based on the area change data,
wherein the adjusting includes determining whether bubbles are contained in the chemical liquid by comparing the area of the chemical liquid discharged outside the leading end of the nozzle and a predetermined area value, based on the area change data during a time period ending when a control signal for terminating the discharging of the chemical liquid is output after the discharging of the chemical liquid from the nozzle is initiated and the discharging of the chemical liquid is stabilized.

2. The method of claim 1, wherein the adjusting further includes when it is determined that the bubbles are contained in the chemical liquid, performing an operation of removing the bubbles in the chemical liquid.

3. The method of claim 1, wherein the adjusting includes adjusting a liquid removal speed of the chemical liquid, based on the area change data in a time period after a control signal for stopping the discharging the chemical liquid from the nozzle is output.

4. The method of claim 1, wherein the adjusting includes obtaining a suck-back time required for suck-back performed by a suck-back valve when the chemical liquid is removed, based on the area change data in a time period after a control signal for stopping the discharging the chemical liquid from the nozzle is output, and adjusting the suck-back time required for the suck-back performed by the suck-back valve, based on the suck-back time and a predetermined setting time.

5. The method of claim 1, further comprising displaying an accumulated image in a time period including a time period until the discharge state is stabilized after a control signal for initiating the discharging the chemical liquid from the nozzle is output.

6. The method of claim 1, further comprising displaying an accumulated image in a time period after a control signal for terminating the discharging the chemical liquid from the nozzle is output.

7. The method of claim 1, wherein the adjusting is performed in an order of:

determining whether bubbles are contained in the chemical liquid by comparing the area of the chemical liquid discharged outside the leading end of the nozzle and a predetermined area value, based on the area change data in the time period until the control signal for terminating the discharging the chemical liquid is output after the discharging the chemical liquid from the nozzle is initiated and the discharging the chemical liquid is stabilized;

performing, when it is determined that the bubbles are contained in the chemical liquid, an operation of removing the bubbles in the chemical liquid;

adjusting a liquid removal speed of the chemical liquid, based on the area change data in a time period after a control signal for stopping the discharging the chemical liquid from the nozzle is output;

obtaining a suck-back time required for suck-back performed by a suck-back valve when the chemical liquid is removed, based on the area change data in a time period after a control signal for stopping the discharging the chemical liquid from the nozzle is output; and adjusting the suck-back time required for the suck-back performed by the suck-back valve, based on the suck-back time and a predetermined setting time.

8. A non-transitory computer-readable storage medium storing a computer program used in a chemical liquid supply device of supplying a chemical liquid for removing a coating film on a peripheral portion of a substrate having the coating film formed on a surface thereof, wherein the computer program includes a group of steps for performing the method according to claim 1.

\* \* \* \* \*